US007308596B1

(12) United States Patent
Hwang et al.

(10) Patent No.: US 7,308,596 B1
(45) Date of Patent: Dec. 11, 2007

(54) CONTROLLING A CLOCK DIVIDER BY SELECTING A PRESET VALUE

(75) Inventors: Frank Hwang, Sunnyvale, CA (US); Gang Shan, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 285 days.

(21) Appl. No.: 10/975,219

(22) Filed: Oct. 27, 2004

Related U.S. Application Data

(60) Provisional application No. 60/515,678, filed on Oct. 30, 2003.

(51) Int. Cl.
*G06F 1/00* (2006.01)

(52) U.S. Cl. ....................................... 713/500; 713/600

(58) Field of Classification Search ................ 713/500, 713/400; 326/93
See application file for complete search history.

(56) References Cited

U.S. PATENT DOCUMENTS

| | | | | |
|---|---|---|---|---|
| 6,535,986 B1 * | 3/2003 | Rosno et al. | ............... | 713/400 |
| 6,735,707 B1 * | 5/2004 | Kapil | ......................... | 713/322 |
| 6,901,524 B2 * | 5/2005 | Watts, Jr. | .................... | 713/320 |
| 6,963,992 B1 * | 11/2005 | Cheng et al. | ............... | 713/501 |
| 7,103,786 B2 * | 9/2006 | Chen et al. | ................. | 713/320 |
| 2005/0022044 A1 * | 1/2005 | Shimosakoda | ............. | 713/600 |

* cited by examiner

*Primary Examiner*—Thomas Lee
*Assistant Examiner*—Jaweed A Abbaszadeh
(74) *Attorney, Agent, or Firm*—Heimlich Law; Alan Heimlich, Esq.

(57) ABSTRACT

A method and apparatus for Clock and PLL N-Divider Switch have been disclosed.

5 Claims, 11 Drawing Sheets

900

Reference clock 902 — 903 → M-divider 904 — 905 → Phase detector, Charge pump, & VCO 906 — 907 → CPU clock output divider 908 — 909 → clock output divider 910-1 — 911-1 → clock output divider 910-y — 911-y →

N-divider 912 — 913

Inputs 936 — n — 937 → Selector Logic Block 920 — 921 — t

914 Look up table: LUT N1, ○, ○, ○, LUT Nm — 915 — q

I²C control register 916 — 917

922 Preset value N1, ○, ○, ○, Preset value Np — 923 — s

CONTROLLING A CLOCK DIVIDER BY SELECTING A PRESET VALUE

RELATED APPLICATION

This patent application claims priority of U.S. Provisional Application Ser. No. 60/515,678 filed Oct. 30, 2003 titled "Method and Apparatus for Clock and PLL N-Divider Switch", which is hereby incorporated herein by reference.

FIELD OF THE INVENTION

The present invention pertains to clock generation. More particularly, the present invention relates to a method and apparatus for clock and PLL N-Divider switch.

BACKGROUND OF THE INVENTION

Clocks are an integral part of electronics. Their use is wide and diverse. Clocks are used for circuit control, to keep track of time, etc. Within the personal computer clocks are used by a variety of logic blocks including, but not limited to, for example, the central processor unit (CPU), as bus clocks, clocks for system chip sets, etc. Additionally they are used to synchronize events and provide a reliable source of a stable frequency.

For example, FIG. 3 illustrates an approach 300 showing clock generation and several system components. Here at clock chip 302 a variety of clock signals 302-1 CPU clock, 302-2 PCK clock, 302-3 SRC clock, and other clocks 302-*n* (such as a PCI clock) are generated and distributed to various components. CPU 304 receives CPU clock 302-1 and may communicate and/or generate clock signals via link 305 for use by the System Chip set 306. Additionally, the Clock chip 302 and system chip set 306 interface via link 307.

Often the speed of a system needs to be adjusted. Often this is accomplished by adjusting the clocks used by the system. For example, in FIG. 3 an External Trigger Event 308 may indicate that a change in system speed is needed. This may be communicated to the CPU 304 as an interrupt signal 309. In one implementation, the interrupt 309 causes the CPU 304 to be interrupted from its processing to effect a change in system speed. This may be accomplished, for example, by having the CPU 304 communicate via link 305 to the system chip set 306 then via 307 to effect a change in the clock chip 302 thereby affecting those clocks 302-1 through 302-*n* possibly needing changing. The CPU 304 in one implementation will cause an I2C signal to be generated which will effect the changes needed in clock chip 302.

FIG. 4 illustrates one implementation 400 inside a clock chip showing two clocks being generated. At 402 is a reference clock which is communicated via link 403 to an M-divider block 404 whose output is communicated via 405 to Phase detector and Charge pump and VCO block 406. The output of the Phase detector and Charge pump and VCO block 406 is communicated via 407 to the CPU clock output divider 408 whose output 409 is communicated to a CPU. Block 406 output via 407 is also communicated to PCI clock output divider 410 whose output 411 is used by, for example, PCI circuits. Block 406 output via 407 also is communicated to N-divider 412 whose output 413 goes back into block 406. N-divider 412 is controlled by outputs communicated via 415 from a look up table (LUT) 414. LUT 414 is controlled by an input from an I2C control register 416 which is communicated to the lookup table via 417. In this way the I2C can control the output frequency at, for example, 409 and 411.

In this implementation, the source of the I2C signals is created by the CPU, for example, 304 in FIG. 3. Thus the CPU which may be interrupted by an external trigger event 308 communicated by 309 to the CPU 304 will result in the CPU 304 generating the I2C signals which change system speed. In this implementation then, CPU resources are required to change the system speed and thus the CPU must process this request and therefore has fewer resources available for processing other task. This implementation then affects the available CPU resources by requiring it to generate signals required for changing system clocks.

FIG. 5 illustrates one implementation 500 inside a clock chip showing two clocks being generated. At 502 is a reference clock which is communicated via link 503 to an M-divider block 504 whose output is communicated via 505 to Phase detector and Charge pump and VCO block 506. The output of the Phase detector and Charge pump and VCO block 506 is communicated via 507 to the CPU clock output divider 508 whose output 509 is communicated to a CPU. Block 506 output via 507 is also communicated to PCI clock output divider 510 whose output 511 is used by, for example, PCI circuits. Block 506 output via 507 also is communicated to N-divider 512 whose output 513 goes back into block 506. N-divider 512 is controlled by outputs communicated via 519 from an I2C control register 516. In this way the I2C can control the output frequency at, for example, 509 and 511.

In this implementation, the source of the I2C signals is created by the CPU, for example, 304 in FIG. 3. Thus the CPU which may be interrupted by an external trigger event 308 communicated by 309 to the CPU 304 will result in the CPU 304 generating the I2C signals which change system speed. In this implementation then, CPU resources are required to change the system speed and thus the CPU must process this request and therefore has fewer resources available for processing other task. This implementation then affects the available CPU resources by requiring it to generate signals required for changing system clocks.

Thus, in one implementation when there is an external event that needs to change system clocks and/or speed (for example, CPU clock, PCI clock etc.), it has to interrupt the CPU from doing normal application programs. The CPU will stop its normal operation to send commands to the system chipset. The System chipset will then program the clock chip to change the speed by using the I2C bus. When the external event is finished, the CPU may be interrupted again to change back to the normal speed. This interrupting will slow down overall system performance. Additionally, sometimes the CPU may be executing a program which does not allowed for interruption. This presents a problem.

BRIEF DESCRIPTION OF THE DRAWINGS

The invention is illustrated by way of example and not limitation in the figures of the accompanying drawings in which.

DETAILED DESCRIPTION

This design, as exemplified in various embodiments of the invention, illustrates how an external event does not need to interrupt a CPU's normal execution for effecting a system clock and/or clock frequency change. The change may be accomplished by changing, for example, a clock chip PLL N-divider directly. Additionally, once the event is finished the CPU can return back to a prior execution speed.

By not having to interrupt a CPU to effect a speed change, the CPU throughput may be enhanced. By implementing speed changes directly, there may be less likelihood of a conflict between programs executing within the CPU, the associated overhead such as task switching, saving state, etc. Additionally, by implementing speed changes without the need for CPU intervention, speed and/or reliability may be enhanced.

Figure 6:
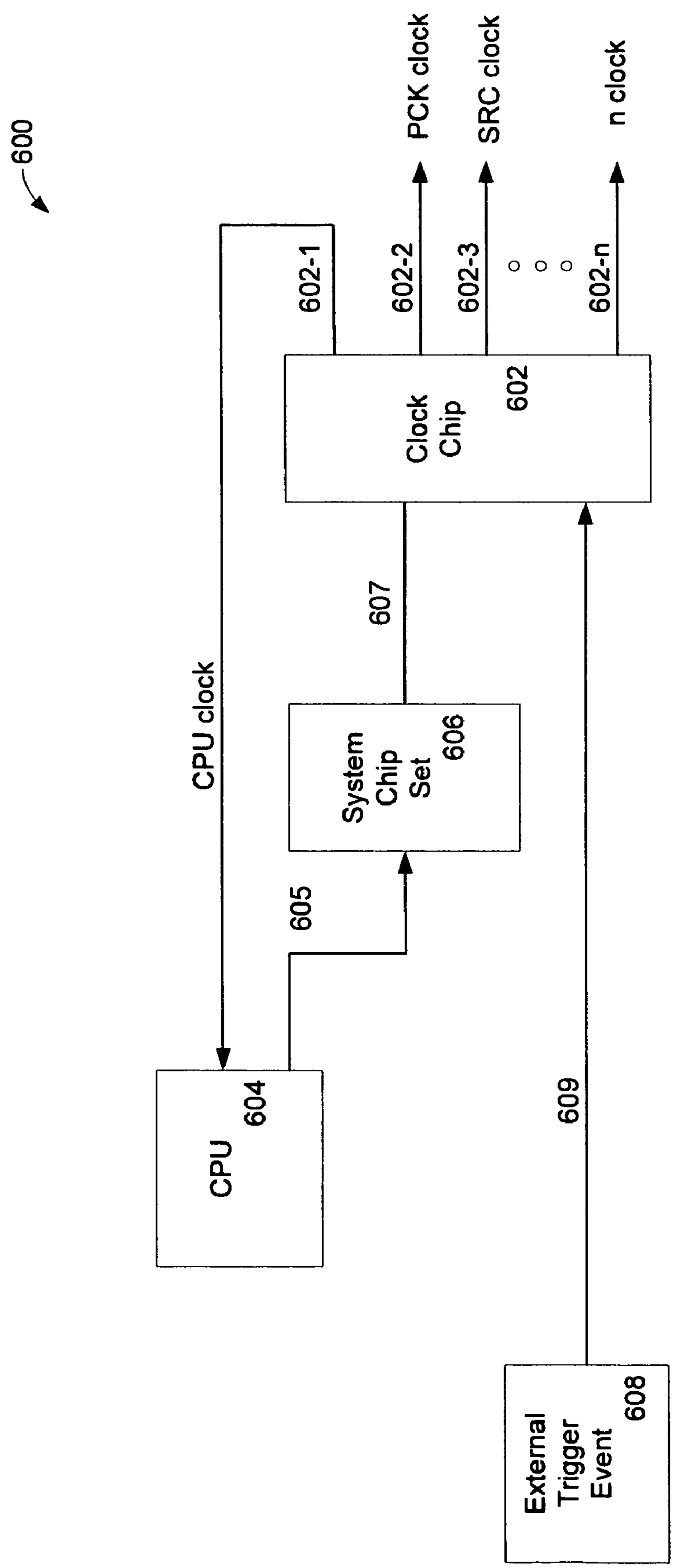
FIG. 6 illustrates one embodiment of the invention showing a top level overview of signals.

FIG. 6 illustrates one embodiment of the invention 600 showing a top level overview of signals. At clock chip 602 a variety of clock signals 602-1 CPU clock, 602-2 PCK clock, 602-3 SRC clock, and other clocks 602-$n$ (such as a PCI clock) are generated and distributed to various components. CPU 604 receives CPU clock 602-1 and may communicate and/or generate clock signals via link 605 for use by the System Chip set 606. Additionally, the Clock chip 602 and system chip set 606 interface via link 607.

The speed of the system may need to be adjusted. In one embodiment, this is may be accomplished by External Trigger Event 608 indicating such a change is needed. This may be communicated to the Clock chip 602 via link 609. While FIG. 6 shows External trigger event 608 as being singular, it is to be appreciated by one of skill in the art that in other embodiments of the invention a variety and plurality of external trigger events and/or signals may be communicated to clock chip 602 to adjust clock frequencies. Additionally, the communication of such signals to clock chip 602 is not necessarily static in nature. That is level sensitive, edge sensitive, as well as time varying signals may be communicated to clock chip 602 to effect changes in clock chip 602.

While the signals communicated to clock chip 602 in FIG. 6 illustrate changing clock frequency, it is to be understood by one of skill in the art that other parameters related to the clock chip may also be affected. For example, slew rate, jitter, drive capability, and other parameters associated with the clock may be adjusted. For example, when driving a system at high-speed, it may be advantageous to carefully match output impedance with what is being driven, slew rate may need to be adjusted, and frequency may need to be dithered to reduce EMI. At lower operating frequencies these parameters may be different as the system may be less sensitive to slower clock operation.

Figure 7:
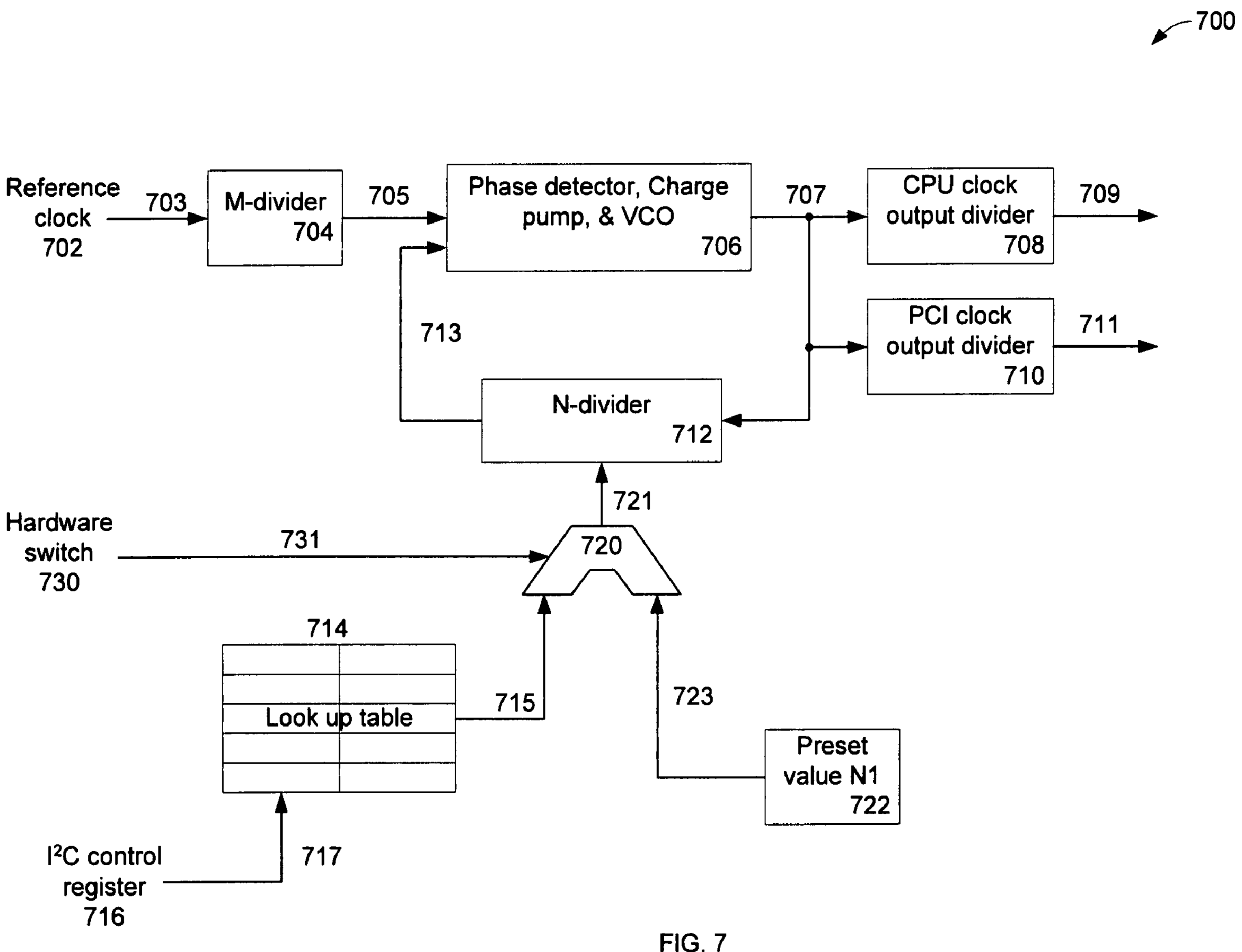
FIG. 7, FIG. 8, and FIG. 9 illustrate various embodiments of the invention showing details of a clock chip implementation.

FIG. 7 illustrates one embodiment of the invention 700 inside a clock chip showing two clocks being generated. At 702 is a reference clock which is communicated via link 703 to an M-divider block 704 whose output is communicated via 705 to Phase detector and Charge pump and VCO block 706. The output of the Phase detector and Charge pump and VCO block 706 is communicated via 707 to the CPU clock output divider 708 whose output 709 is communicated to a CPU. Block 706 output via 707 is also communicated to PCI clock output divider 710 whose output 711 is used by, for example, PCI circuits. Block 706 output via 707 also is communicated to N-divider 712 whose output 713 goes back into block 706. N-divider 712 is controlled by outputs communicated via 721 from a switch or multiplexer 720 whose inputs are 715 from a look up table (LUT) 714 or 722 from a Preset Value N1 722. LUT 714 may be controlled by an input from an I2C control register 716 which is communicated to the lookup table via 717. In this way the I2C can control the output frequency at, for example, 709 and 711. Additionally, Preset value N1 722 is selectable via the multiplexer 720. Multiplexer 720 is controlled by a signal 731 from, for example, a hardware switch 730.

What is to be appreciated is that in this embodiment of the invention, a traditional I2C control may be used as well as a preset value N1 722. The look up table value 714 or the preset value 722 may be selected by the multiplexer 720 in response to an input signal from, for example, hardware switch 730. It is to be understood that 730 represents a source of a signal which is communicated via 731 to the multiplexer 720 to select, in this embodiment, one of two sources of a signal 721 which controls N-divider 712. In other embodiments one of skill in the art will appreciate that the multiplexer 720 may select from more than two sources and that the signals controlling the multiplexer, represented by 731 may be one or more signals. Additionally, the signals controlling the multiplexer need not be static nature, that is they may dynamically change and the signal communicated to the multiplexer need not be a level sensitive signal.

Figure 8:
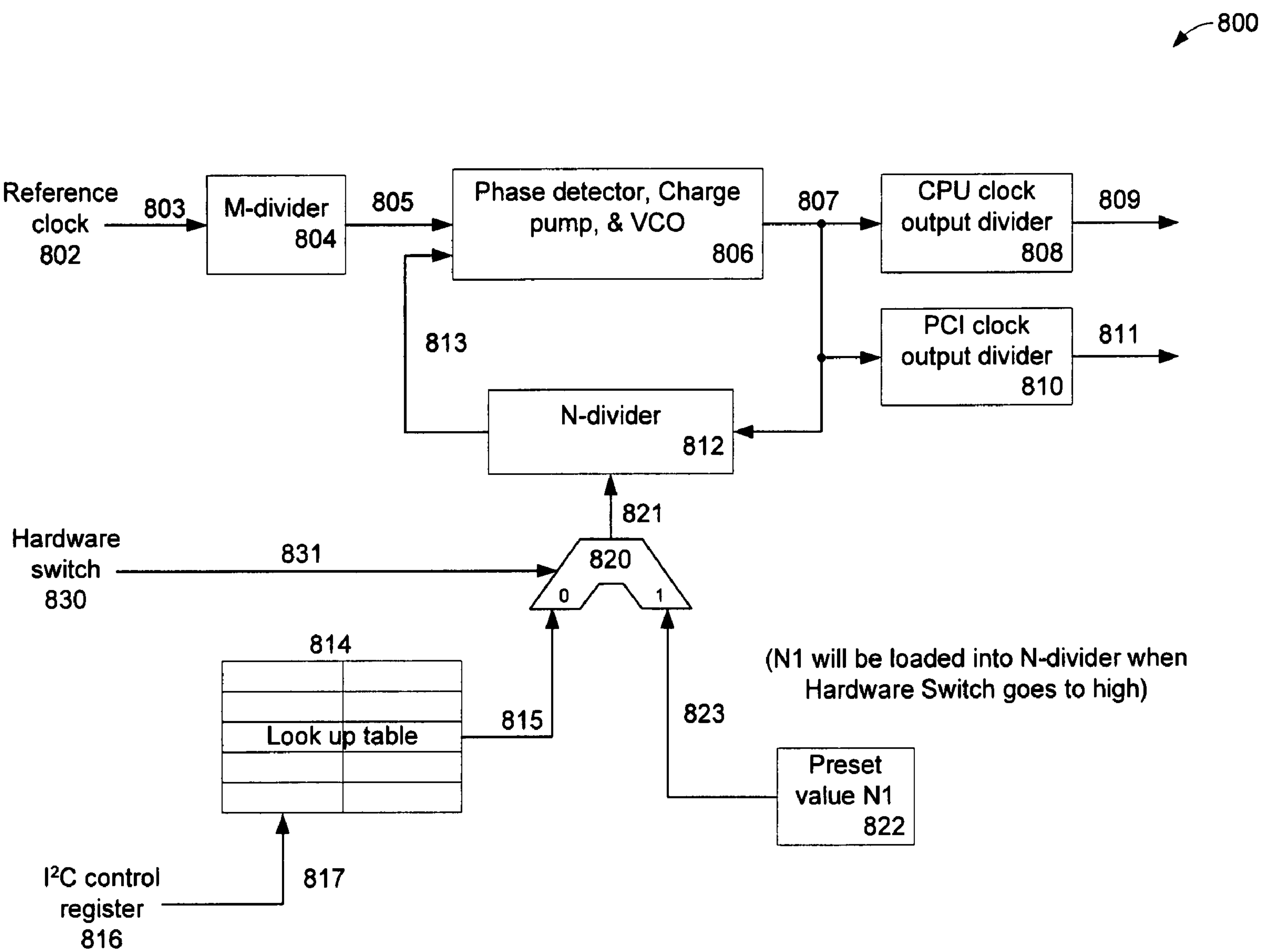

FIG. 8 illustrates one embodiment of the invention 800 inside a clock chip showing two clocks being generated. At 802 is a reference clock which is communicated via link 803 to an M-divider block 804 whose output is communicated via 805 to Phase detector and Charge pump and VCO block 806. The output of the Phase detector and Charge pump and VCO block 806 is communicated via 807 to the CPU clock output divider 808 whose output 809 is communicated to a CPU. Block 806 output via 807 is also communicated to PCI clock output divider 810 whose output 811 is used by, for example, PCI circuits. Block 806 output via 807 also is communicated to N-divider 812 whose output 813 goes back into block 806. N-divider 812 is controlled by outputs communicated via 821 from a switch or multiplexer 820 whose inputs are 815 from a look up table (LUT) 814 or 823 from a Preset Value N1 822. LUT 814 may be controlled by an input from an I2C control register 816 which is communicated to the lookup table via 817. In this way the I2C can control the output frequency at, for example, 809 and 811. Additionally, Preset value N1 822 is selectable via the multiplexer 820. Multiplexer 820 is controlled by a signal 831 from, for example, a hardware switch 830. In this embodiment, preset value N1 822 is loaded into the N-divider once the signal from the hardware switch 830 goes active (high in this example).

Figure 9:
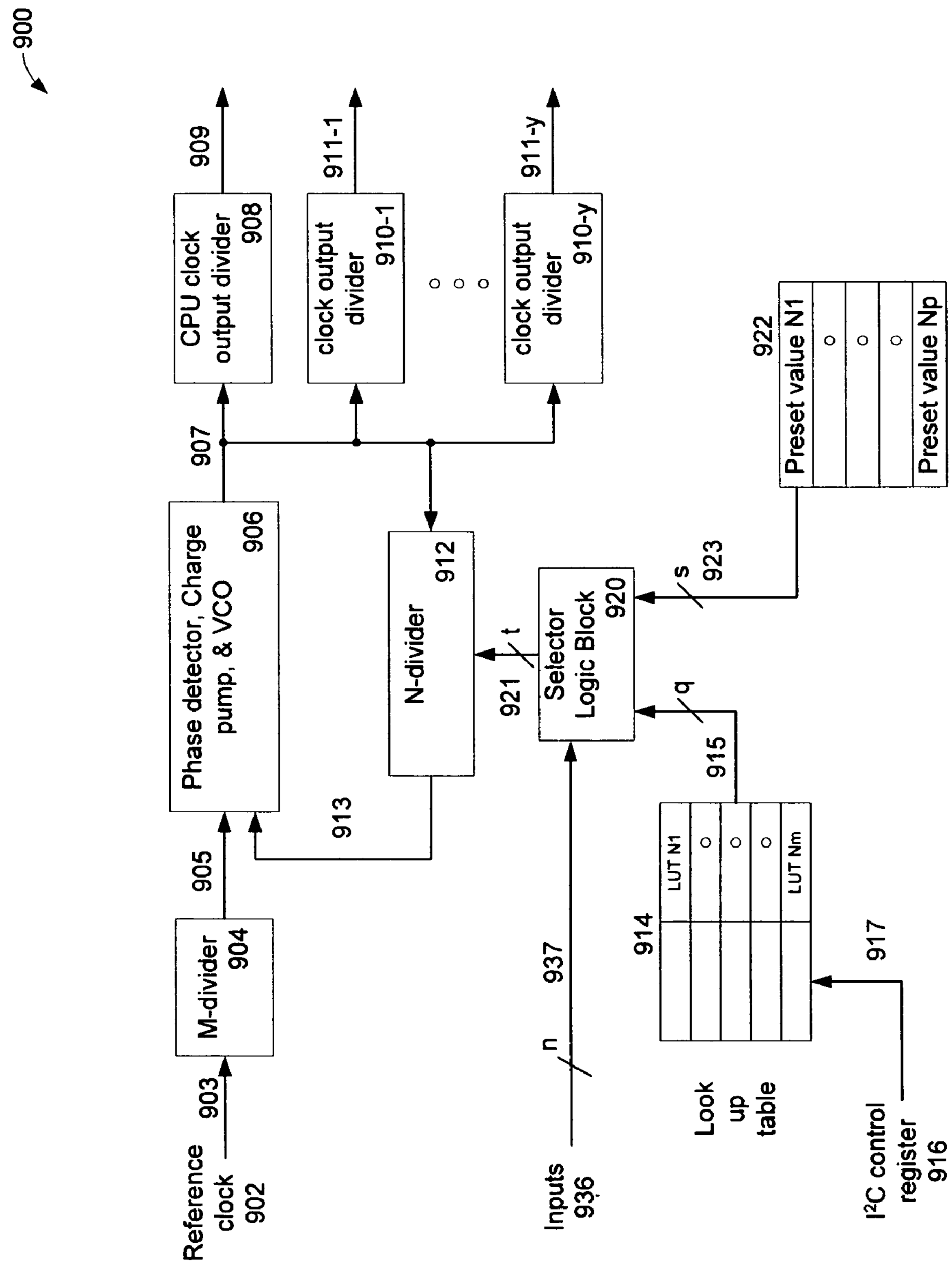

FIG. 9 illustrates one embodiment of the invention 900 inside a clock chip showing clocks being generated. At 902 is a reference clock which is communicated via link 903 to an M-divider block 904 whose output is communicated via 905 to Phase detector and Charge pump and VCO block 906. The output of the Phase detector and Charge pump and VCO block 906 is communicated via 907 to the CPU clock output divider 908 whose output 909 is communicated to a CPU. Block 906 output via 907 is also communicated to clock output divider 910-1 to 910-$y$ whose outputs 911-1 to 911-$y$ are used by other parts of the system, for example, PCI circuits, etc. Block 906 output via 907 also is communicated to N-divider 912 whose output 913 goes back into block 906. N-divider 912 is controlled by outputs (t) communicated via 921 from selector logic block 920 whose inputs (q) are 915 from a look up table (LUT) 914 or (s) 923 from a Preset Value N1 through Np 922. LUT 914 may be controlled by an input from an I2C control register 916 which is communicated to the lookup table via 917. In this way the I2C can control the output frequency at, for example, 909 and 911-1 through 911-*y*. Additionally, Preset value N1 through preset value Np 922 is selectable via the selector logic block 920. The selector logic block takes as inputs the LUT entries, the preset values and the inputs (n) from 936 communicated via 937.

What is to be appreciated, in this embodiment is that selector logic block 920 may select to use lookup table entries 914 or various preset values 922 based, for example, on a variety of inputs 936 received via 937. One of skill on the art will appreciate that this provides a greater flexibility in clock generation. For example various parts of a system may operate at various clock frequencies and thus generate varying amounts of heat. For optimum performance it may be necessary to slow down a system that is generating too much heat. However, slowing down an entire system because only one section is overheating may be a waste of resources. In the embodiment illustrated in FIG. 9, it would be possible for the signals 936, for example, to include such parameters as temperature measurements at various points in the system. Based on this information the selector logic block may control the N-divider 912 as well as several N-dividers (not shown in FIG. 9) to generate appropriate clock signals (other N-divider clock signals not shown). In this way only the systems needing to slow down may be affected.

Figures 10A, 10B:
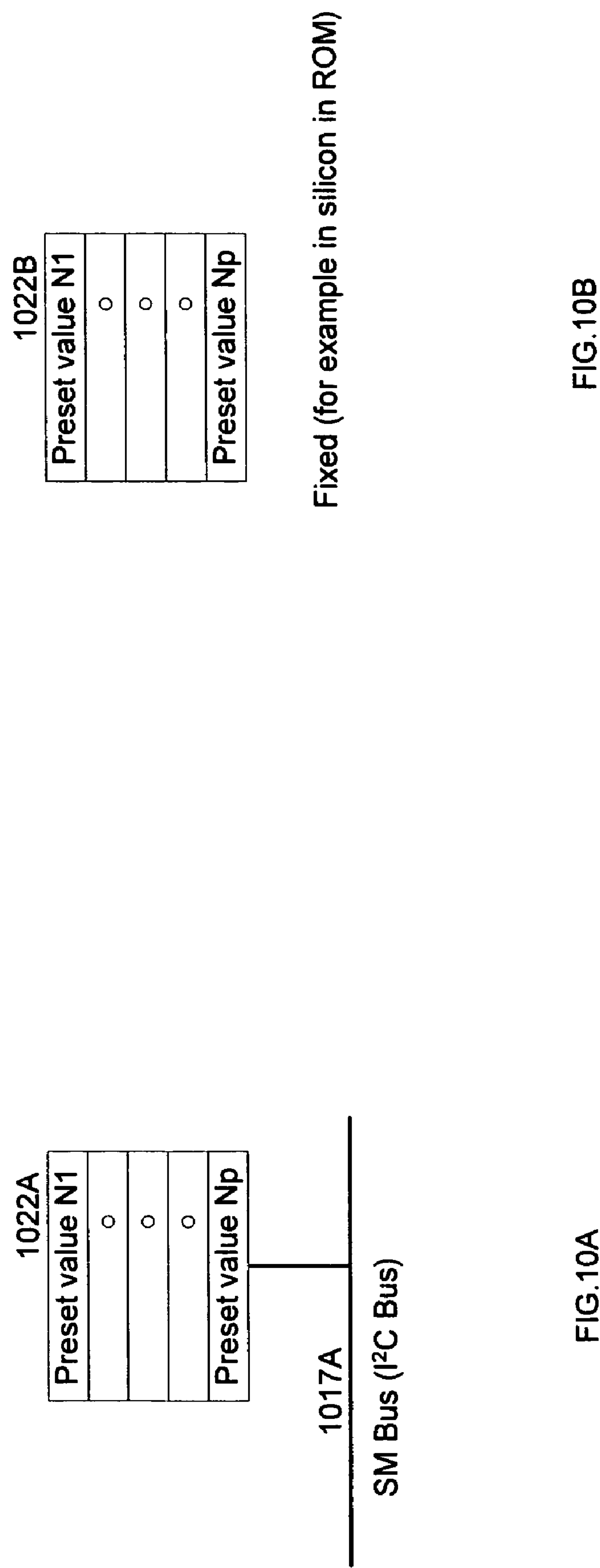
FIG. 10A and FIG. 10B illustrate other embodiments of the invention.

FIG. 10A and FIG. 10B illustrate other embodiments of the invention. Preset values N1 through Np at 1022A in FIG. 10A in one embodiment are programmed via 1017A which may be connected to an SM bus, I2C bus, etc. The preset values in 1022A may be stored in, but are not limited to, such circuit devices as RAM, EPROM, flash, etc. That is, the preset values in 1022A may be stored in such a fashion as to be either volatile or nonvolatile.

One of skill in the art will appreciate that preset values (e.g. FIG. 10 1022A) may be communicated (e.g. FIG. 10A 1017A) and that the values themselves may have come from other communication sources (e.g. FIG. 2, FIG. 1) and may involve communicating a payment and/or credit.

In FIG. 10B preset values N2 through Np at 1022B are fixed in on the chip (such as on silicon). The values may be set at chip fabrication, or after fabrication in a one time programming manner. That is the preset values N1 through Np may be stored via such devices as a ROM, EPROM, fuse programmable, laser cuts, implants, etc.

Figure 11:
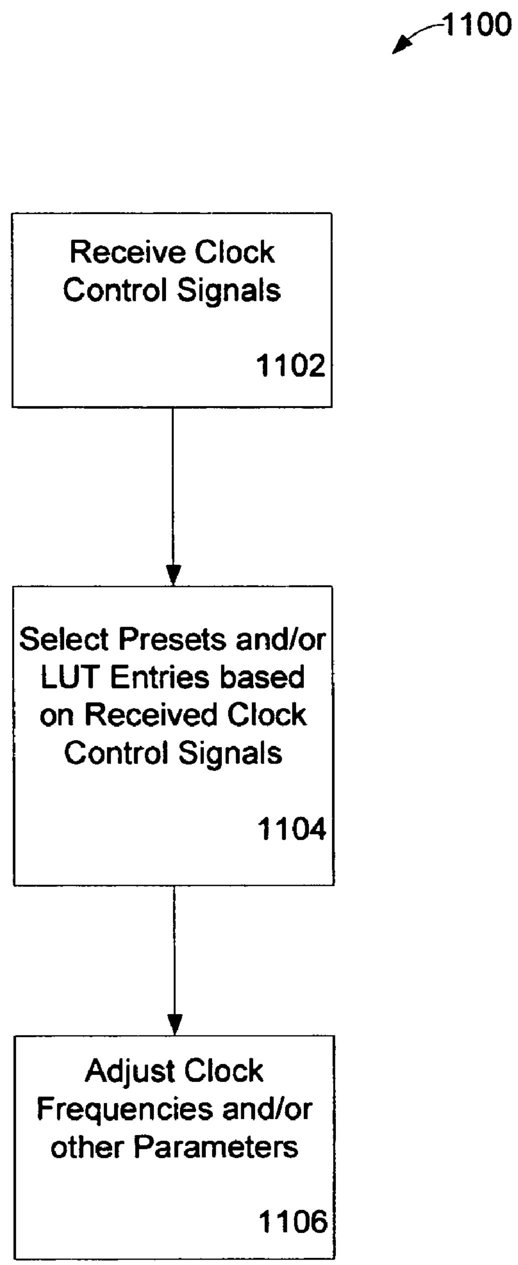
FIG. 11 illustrates one embodiment of the invention in flow chart form.

FIG. 11 illustrates one embodiment of the invention 1100 in flow chart form. At 1102 clock control signals are received, at 1104 presets and/or look up table entries are selected based on the received clock control signals. At 1106 clock frequencies and/or other parameters or adjusted based upon the selected presets and/or look up table entries from 1104.

Thus a method and apparatus for Clock and PLL N-Divider Switch have been described.

Figure 1:
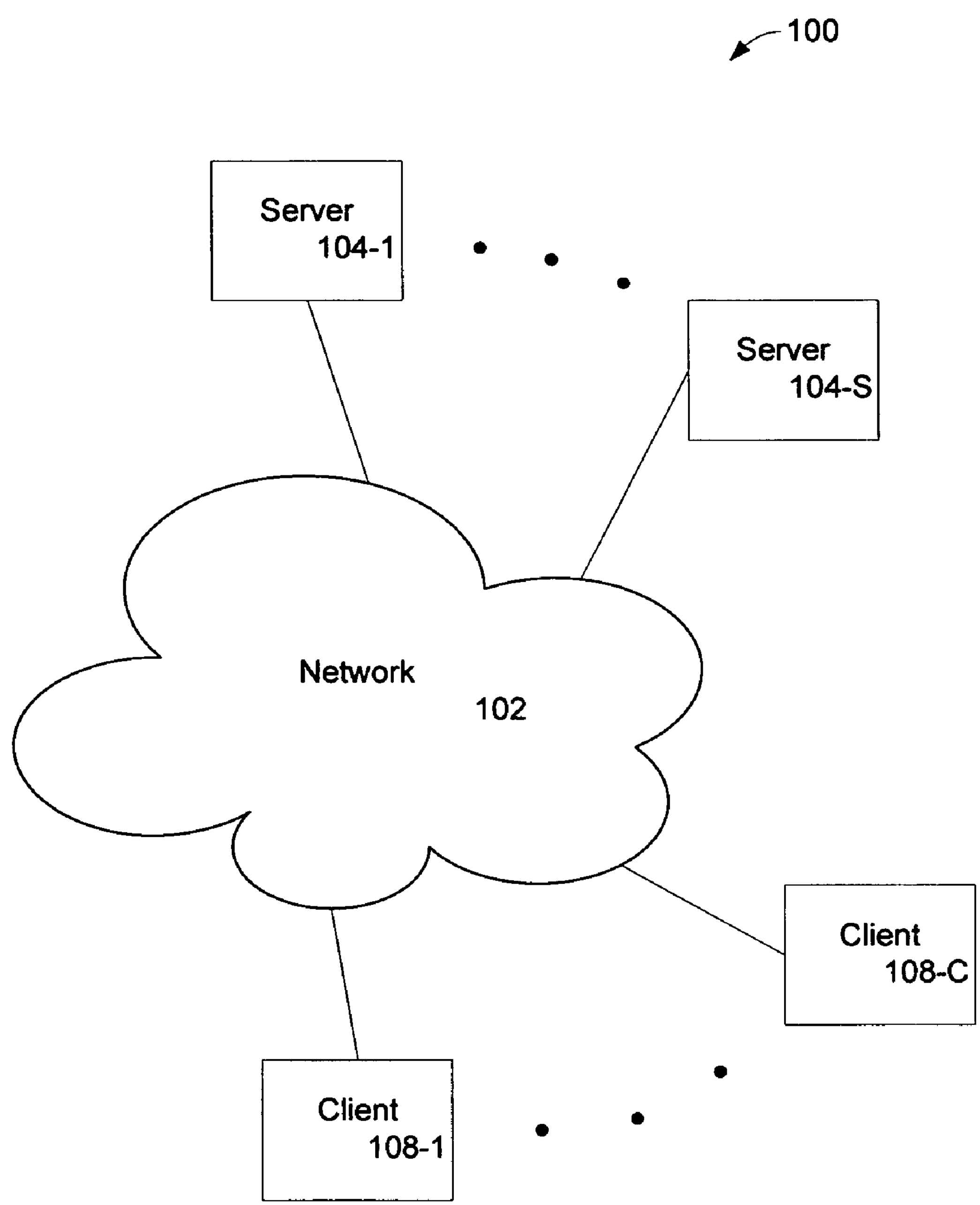
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
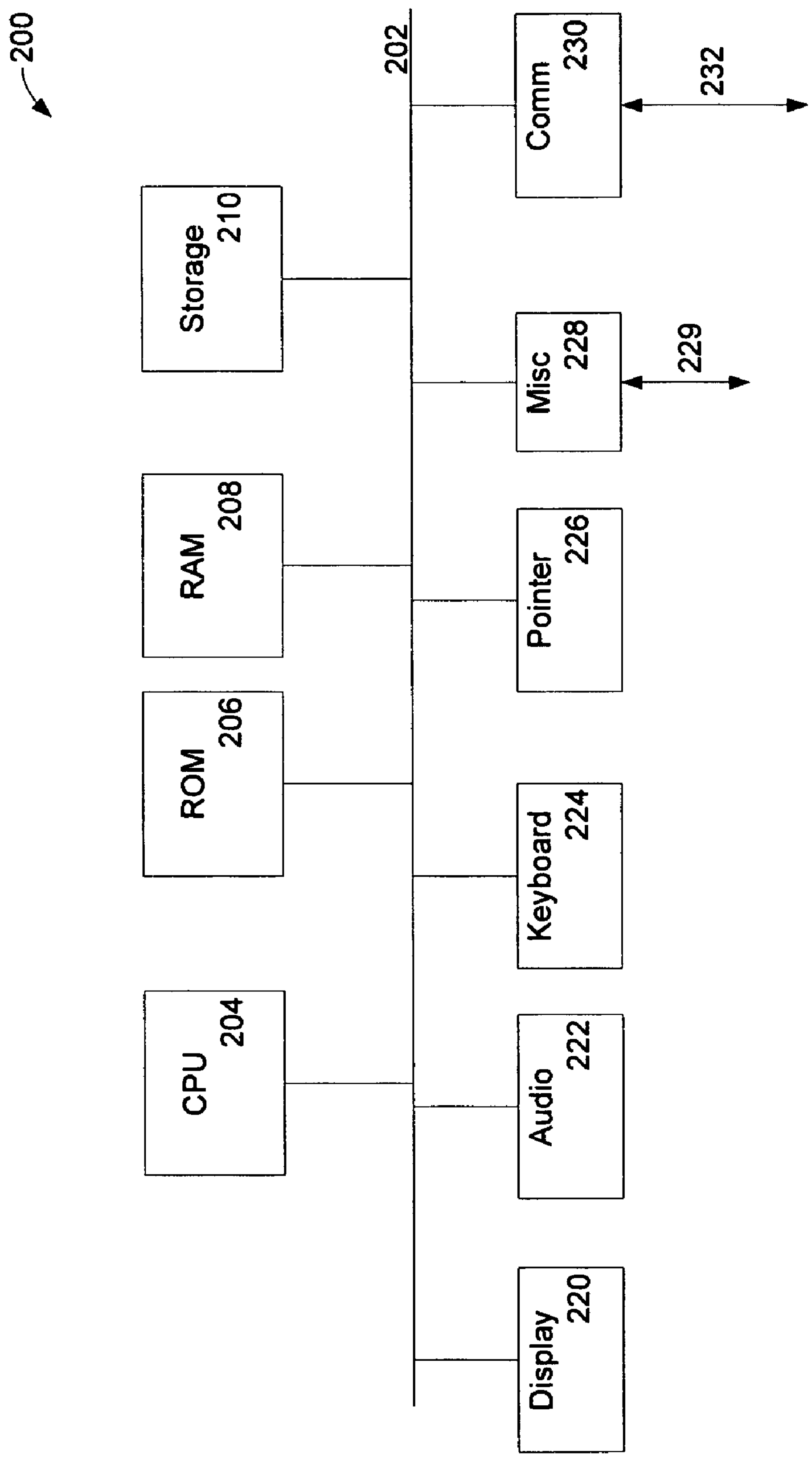
FIG. 2 is a block diagram of a computer system in which some embodiments of the invention may be used.
Figure 3:
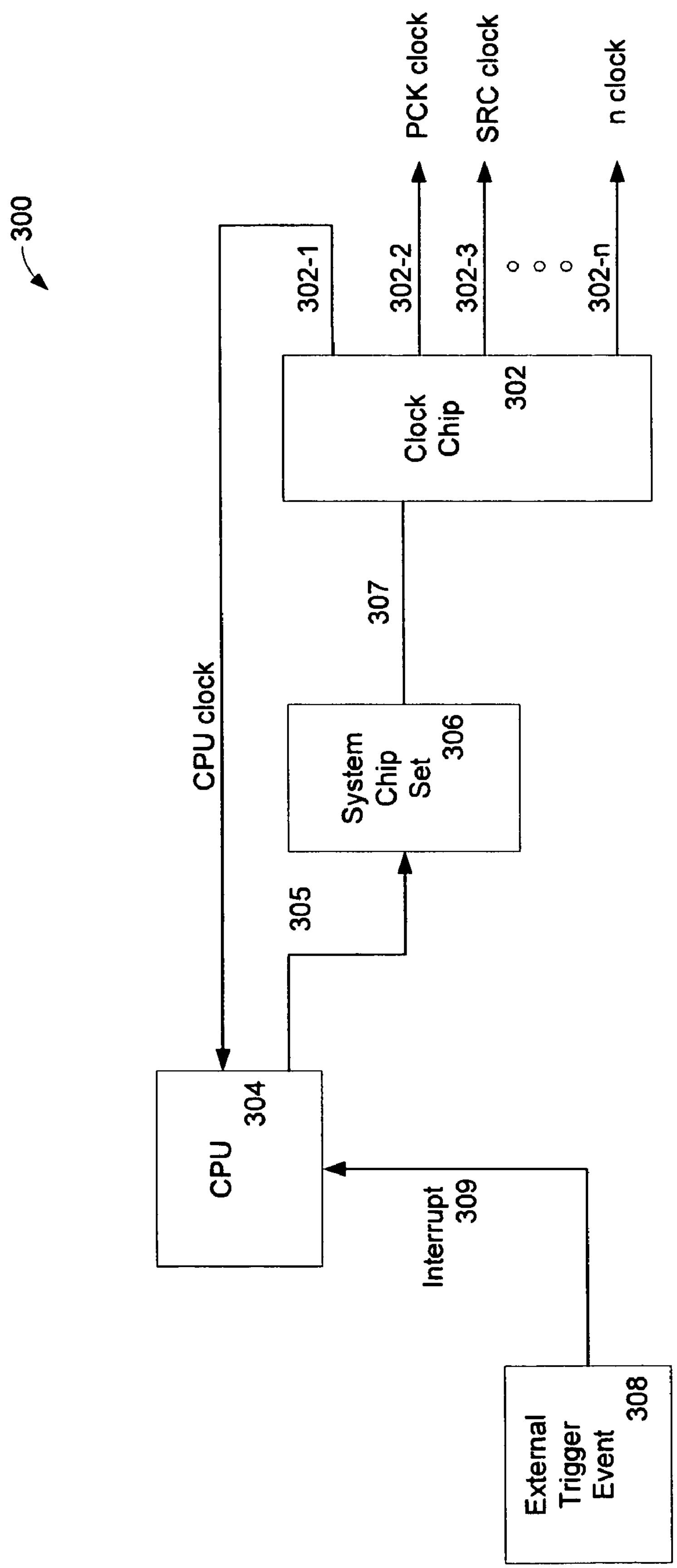
FIG. 3, FIG. 4, and FIG. 5 illustrate several current approaches.
Figure 4:
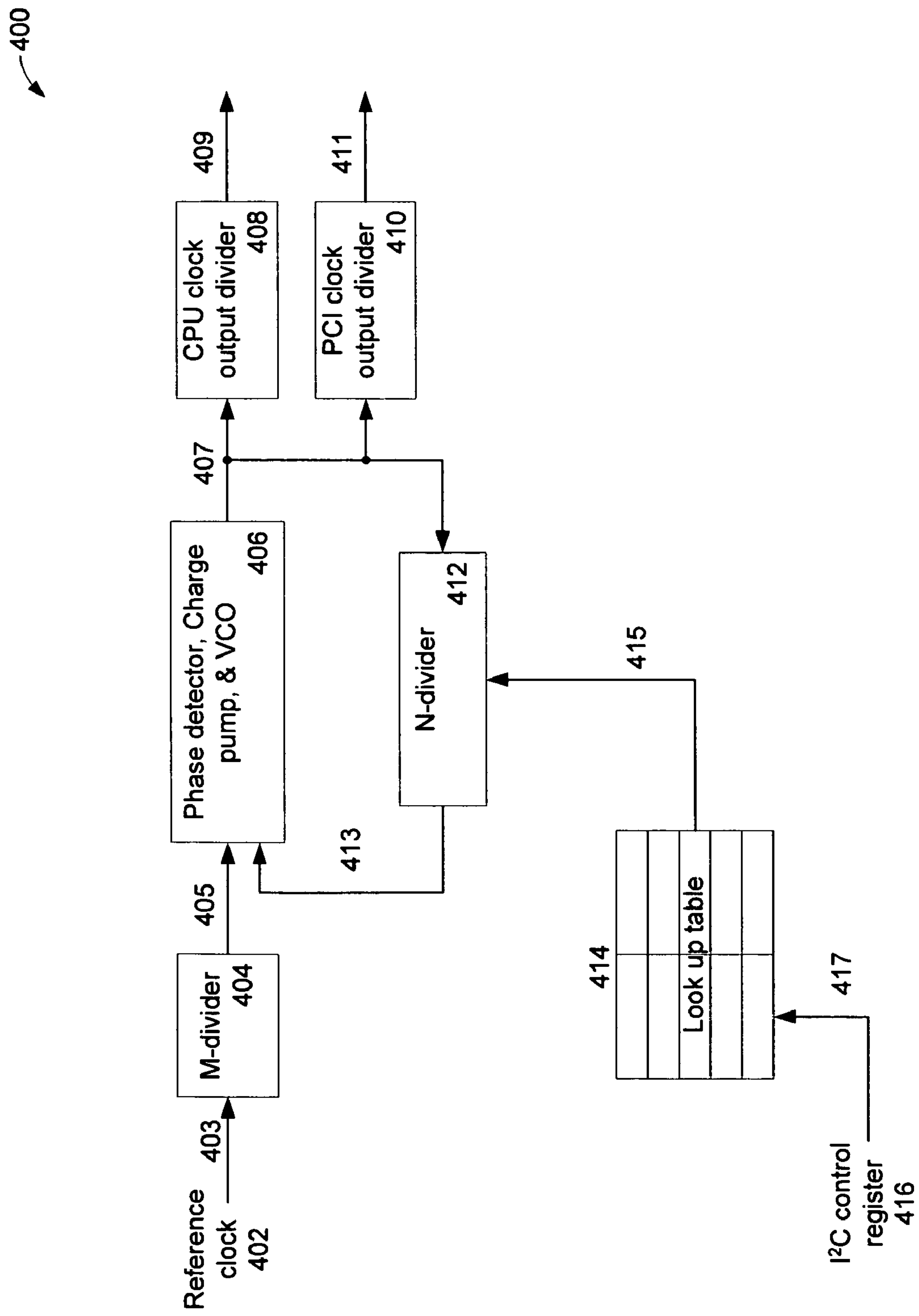
Figure 5:
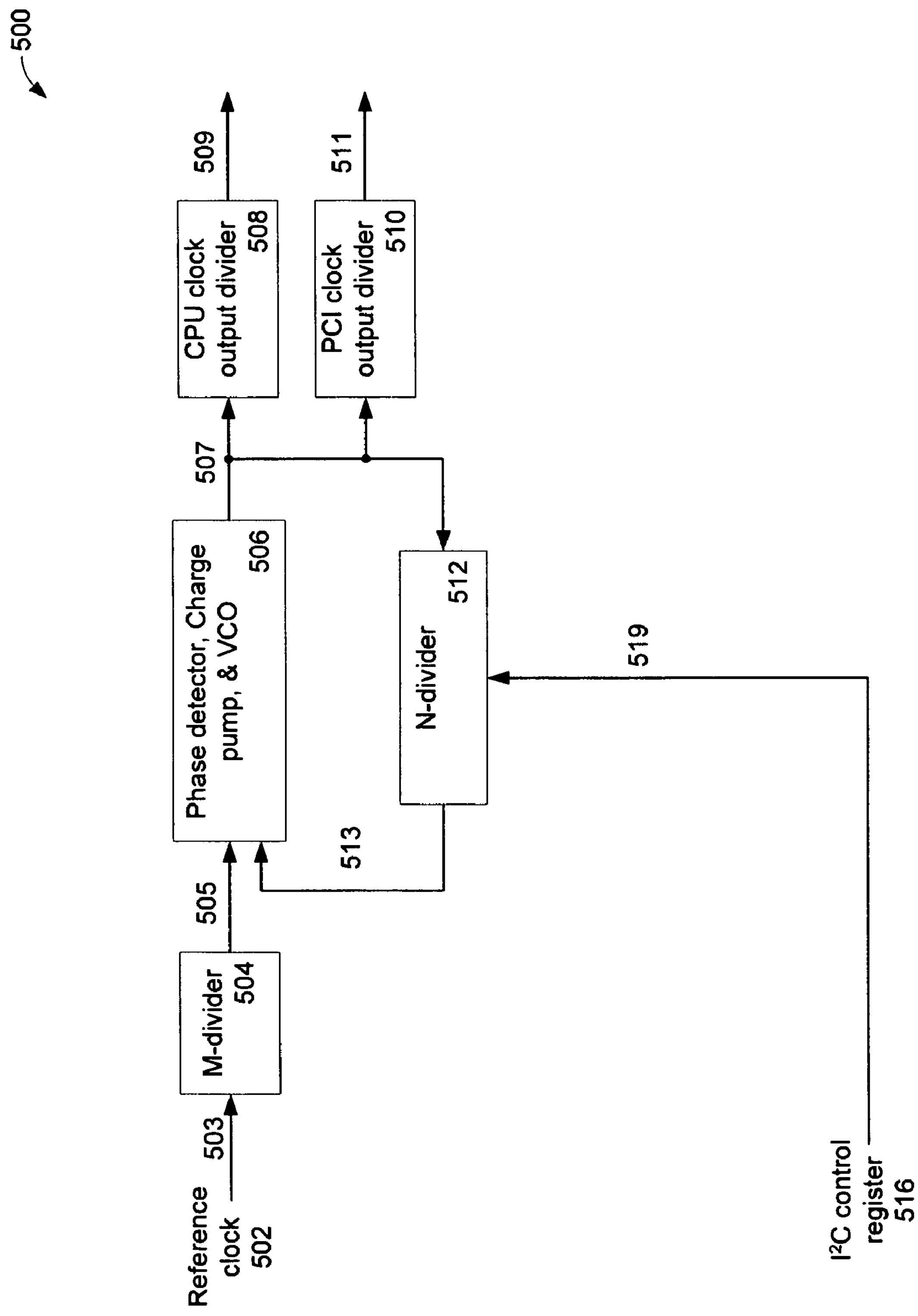

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for Clock and PLL N-Divider Switch have been described.

What is claimed is:

1. An apparatus comprising:

an input capable of receiving a control signal;

a first set of preset values;

a second set of preset values;

a selector having a control input, a first input, a second input, and an output, said control input in communication with said control signal, said first input in communication with said first set of preset values, said second input in communication with said second set of preset values;

a divider having a control input, an input, an output, said control input in communication with said selector output, said input in communication with a source, and said output in communication with a destination; and wherein said first set of preset values and second set of preset values are stored in a memory selected from the group consisting of a LUT (look up table), a volatile memory, a previously loaded non-volatile memory, and a dynamically loaded memory.

2. The apparatus of claim 1 wherein said source is a reference clock and said destination is a circuit block containing a circuit element selected from the group consisting of a phase detector, a charge pump, and a VCO (voltage controlled oscillator).

3. The apparatus of claim 1 wherein said source is an output of a circuit block containing a circuit element selected from the group consisting of a phase detector, a charge pump, and a VCO, and said destination is an input of said circuit block.

4. The apparatus of claim 1 wherein said previously loaded non-volatile memory further comprises communicating a payment and/or credit.

5. A computer readable storage medium having stored thereon information representing the apparatus of claim 1.

* * * * *